United States Patent
Tanaka et al.

(10) Patent No.: US 9,018,634 B2
(45) Date of Patent: Apr. 28, 2015

(54) SEMICONDUCTOR DEVICE

(71) Applicant: Panasonic Corporation, Osaka (JP)

(72) Inventors: Kenichiro Tanaka, Osaka (JP); Tetsuzo Ueda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/165,405

(22) Filed: Jan. 27, 2014

(65) Prior Publication Data

US 2014/0138704 A1    May 22, 2014

Related U.S. Application Data

(63) Continuation of application No. PCT/JP2012/005020, filed on Aug. 7, 2012.

(30) Foreign Application Priority Data

Aug. 8, 2011 (JP) .................. 2011-172983

(51) Int. Cl.
*H01L 29/778* (2006.01)
*H01L 29/417* (2006.01)
(Continued)

(52) U.S. Cl.
CPC ........ *H01L 29/778* (2013.01); *H01L 29/41725* (2013.01); *H01L 29/66462* (2013.01); *H01L 29/7787* (2013.01); *H01L 29/2003* (2013.01)

(58) Field of Classification Search
CPC .............. H01L 29/2003; H01L 29/778; H01L 29/7786; H01L 29/7787; H01L 29/66431; H01L 29/66462; H01L 29/41725
USPC .................................... 257/76, 194
See application file for complete search history.

(56) References Cited

U.S. PATENT DOCUMENTS

2004/0227211 A1   11/2004   Saito et al.
2006/0260870 A1   11/2006   Nakagawa et al.
(Continued)

FOREIGN PATENT DOCUMENTS

JP    2004-342907 A    12/2004
JP    2006-267476 A    10/2006
(Continued)

OTHER PUBLICATIONS

Binari, S.C., et al: "Fabrication and Characterization of GaN FETs", Solid State Electronics, vol. 41, No. 10, 1997, pp. 1549-1554.
(Continued)

*Primary Examiner* — Matthew W Such
*Assistant Examiner* — Scott Stowe
(74) *Attorney, Agent, or Firm* — McDermott Will & Emery LLP

(57) ABSTRACT

A semiconductor device includes a field effect transistor that has a first nitride semiconductor layer and a second nitride semiconductor layer larger in bandgap than the first nitride semiconductor layer formed on a substrate in this order and a gate electrode, a source electrode, and a drain electrode, and uses two-dimensional electron gas formed at the interface between the first and second nitride semiconductor layers as the channel. The field effect transistor further has a p-type nitride semiconductor layer formed between the gate electrode and the drain electrode and electrically connected to the drain electrode.

10 Claims, 12 Drawing Sheets

(51) Int. Cl.
*H01L 29/66* (2006.01)
*H01L 29/20* (2006.01)

(56) References Cited

U.S. PATENT DOCUMENTS

2010/0097105 A1    4/2010    Morita et al.
2011/0260217 A1    10/2011   Okamoto et al.

FOREIGN PATENT DOCUMENTS

| JP | 2008-172055 A | 8/2008 |
| JP | 2011-151176 A | 8/2011 |
| WO | 2008-062800 A1 | 5/2008 |
| WO | 2010-082272 A1 | 7/2010 |

OTHER PUBLICATIONS

Vetury, R., et al.: "The Impact of Surface States on the DC and RF Characteristics of AlGaN/GaN HFETs", IEEE Transactions of Electron Devices, vol. 48, No. 3, Mar. 2001, pp. 560-566.

Uemoto, Y, et al.: "Gate Injection Transistor (GIT)—A Normally-Off AlGaN/GaN Power Transistor Using Conductivity Modulation", IEEE Transactions of Electron Devices, vol. 54, No. 12, Dec. 2007, pp. 3393-3399.

International Search Report issued in PCT/JP2012/005020, dated Oct. 16, 2012, with English translation, 5 pages.

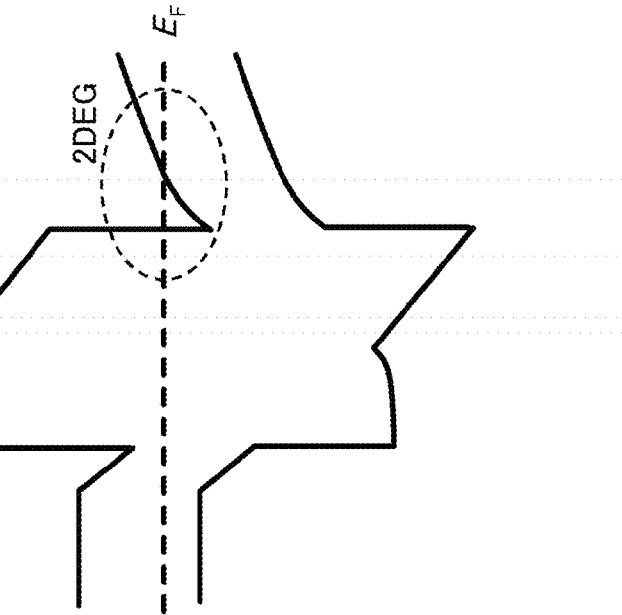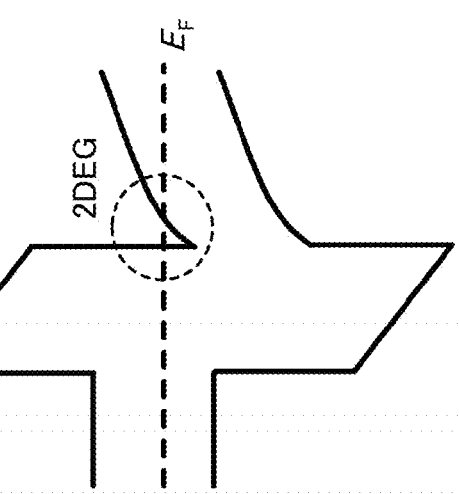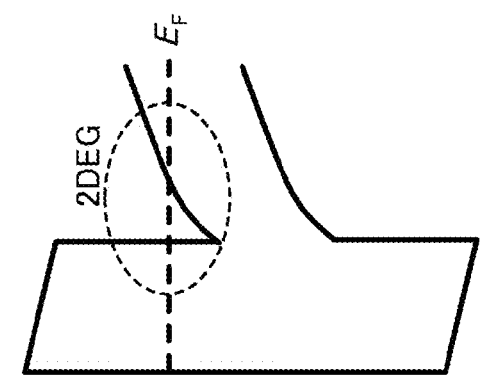

SEMICONDUCTOR DEVICE

CROSS-REFERENCE TO RELATED APPLICATIONS

This is a continuation of International Application No. PCT/JP2012/005020 filed on Aug. 7, 2012, which claims priority to Japanese Patent Application No. 2011-172983 filed on Aug. 8, 2011. The entire disclosures of these applications are incorporated by reference herein.

BACKGROUND

The present disclosure relates to nitride field effect transistors applicable to power transistors used for power supply circuits of consumer appliances such as air conditioners and light controllers, for example.

Nitride semiconductors are large in bandgap, breakdown electric field, and electron saturated drift velocity compared with Si, GaAs, etc. Also, in an AlGaN/GaN heterostructure formed on a substrate having (0001) plane as its principal surface, two-dimensional electron gas (also expressed as "2DEG") is generated at its heterointerface due to spontaneous polarization and piezoelectric polarization, whereby a sheet carrier concentration of the order of $1\times10^{13}$ cm$^{-2}$ is obtained even without doping of any impurity. A high electron mobility transistor (HEMT) using this high-concentration 2DEG as a carrier has recently been attracting attention, and various HEMT structures have been proposed (see S. C. Binari, W. Kruppa, H. B. Dietrich, G. Kelner, A. E. Wickenden, and J. A. Freitas Jr., "Fabrication and Characterization of GaN FETs," Solid State Electronics 41 (1997) 1549-1554).

FIG. 12 is a cross-sectional view showing a semiconductor device including a conventional HEMT having an AlGaN/GaN heterostructure. In the conventional field effect transistor shown in FIG. 12, a low-temperature AlN buffer layer 2, an undoped GaN layer 3, and an undoped AlGaN layer 4 are formed in this order on an Si Substrate 1, and a source electrode 5 and a drain electrode 6 are formed to be in contact with the undoped AlGaN layer 4. A gate electrode 7 is formed between the source electrode 5 and the drain electrode 6.

With the above-described structure, two-dimensional electron gas is generated near the interface between the undoped GaN layer 3 and the undoped AlGaN layer 4 due to spontaneous polarization and piezoelectric polarization, and this gas is used as a carrier. When a voltage is applied between the source and the drain, electrons in the channel flow from the source electrode 5 toward the drain electrode 6. At this time, by controlling a voltage applied to the gate electrode 7 to change the thickness of a depletion layer right under the gate electrode 7, the drain current can be controlled.

SUMMARY

In the field effect transistor using two-dimensional electron gas present at the AlGaN/GaN heterointerface as described above, however, it is known that a phenomenon called "current collapse" may possibly occur causing a problem in the reliability of the device. The current collapse as used herein refers to a phenomenon that, once a high voltage is applied to the drain of a field effect transistor in its off state, the on resistance at the time when the field effect transistor is next switched to its on state will increase.

The mechanism of the current collapse is described in the above-cited literature "Fabrication and Characterization of GaN FETs, Solid State Electronics 41 (1997) 1549-1554."

Here the mechanism of the current collapse will be briefly described with reference to FIG. 2.

FIG. 2 is a cross-sectional view of the semiconductor device including the general HEMT shown in FIG. 12 in its off state. As shown in FIG. 2, a depletion layer 12 as illustrated is generated when the HEMT as the field effect transistor is off. At this time, a high electric field is generated in a region 13 on the drain terminal-side of the depletion layer 12, and electrons are trapped in this region.

When the trapped electrons are present near the two-dimensional electron gas, they bring about an effect similar to that brought about when a negative-bias gate voltage is applied. Thus, the concentration of the two-dimensional electron gas near the trapped electrons decreases, resulting in increase in on-voltage and decrease in the current at the time when the device is turned on. This is the mechanism of development of current collapse.

According to a semiconductor device of an example of the present disclosure, occurrence of current collapse can be prevented or reduced in a field effect transistor using nitride semiconductors.

To solve the above-described problem, a semiconductor device of an example of the present disclosure includes a field effect transistor that has a first nitride semiconductor layer formed on a substrate, a second nitride semiconductor layer larger in bandgap than the first nitride semiconductor layer formed on the first nitride semiconductor layer, a gate electrode formed on the second nitride semiconductor layer, and a source electrode and a drain electrode formed to sandwich the gate electrode each being in contact with at least the second nitride semiconductor layer, and uses two-dimensional electron gas formed at an interface between the first nitride semiconductor layer and the second nitride semiconductor layer as a channel. The field effect transistor further has a p-type nitride semiconductor layer formed on the second nitride semiconductor layer at a position between the gate electrode and the drain electrode and electrically connected to the drain electrode.

In a field effect transistor in its off state, in which a high electric field is applied to a region of the first nitride semiconductor layer located between the source and the drain, a number of electrons are left behind in the region after the transistor is switched to its on state. With the configuration described above, holes can be injected into the first nitride semiconductor layer from the p-type nitride semiconductor layer formed between the gate electrode and the drain electrode when the field effect transistor is in the on state. Thus, the remaining electrons in the first nitride semiconductor layer can be effectively eliminated at the switching from the off state to the on state. It is therefore possible to prevent or reduce current collapse, and thus reduce the on resistance of the field effect transistor immediately after the switching to the on state.

In addition, with the n-type nitride semiconductor layer formed between the p-type nitride semiconductor layer and the first nitride semiconductor layer, the reduction in the concentration of the two-dimensional electron gas caused by the formation of the p-type nitride semiconductor layer can be prevented or reduced. It is therefore possible to reduce the on resistance of the field effect transistor even when the drain voltage is low while preventing or reducing current collapse.

BRIEF DESCRIPTION OF THE DRAWINGS

FIG. 4 is a cross-sectional view diagrammatically showing the state of a semiconductor device observed immediately after a field effect transistor, which has been turned off and then to which a drain voltage has been applied, is turned on.

FIG. 6 is a cross-sectional view diagrammatically showing the state of the semiconductor device shown in FIG. 5 observed immediately after the field effect transistor, which has been turned off, is turned on.

FIGS. 10A to 10C are diagrammatic band diagrams of a field effect transistor having no structure for hole injection, one having a structure for hole injection, and one having an n-type nitride semiconductor layer provided right under the structure for hole injection.

DETAILED DESCRIPTION

Embodiment

Description of Field Effect Transistor

Figure 1:
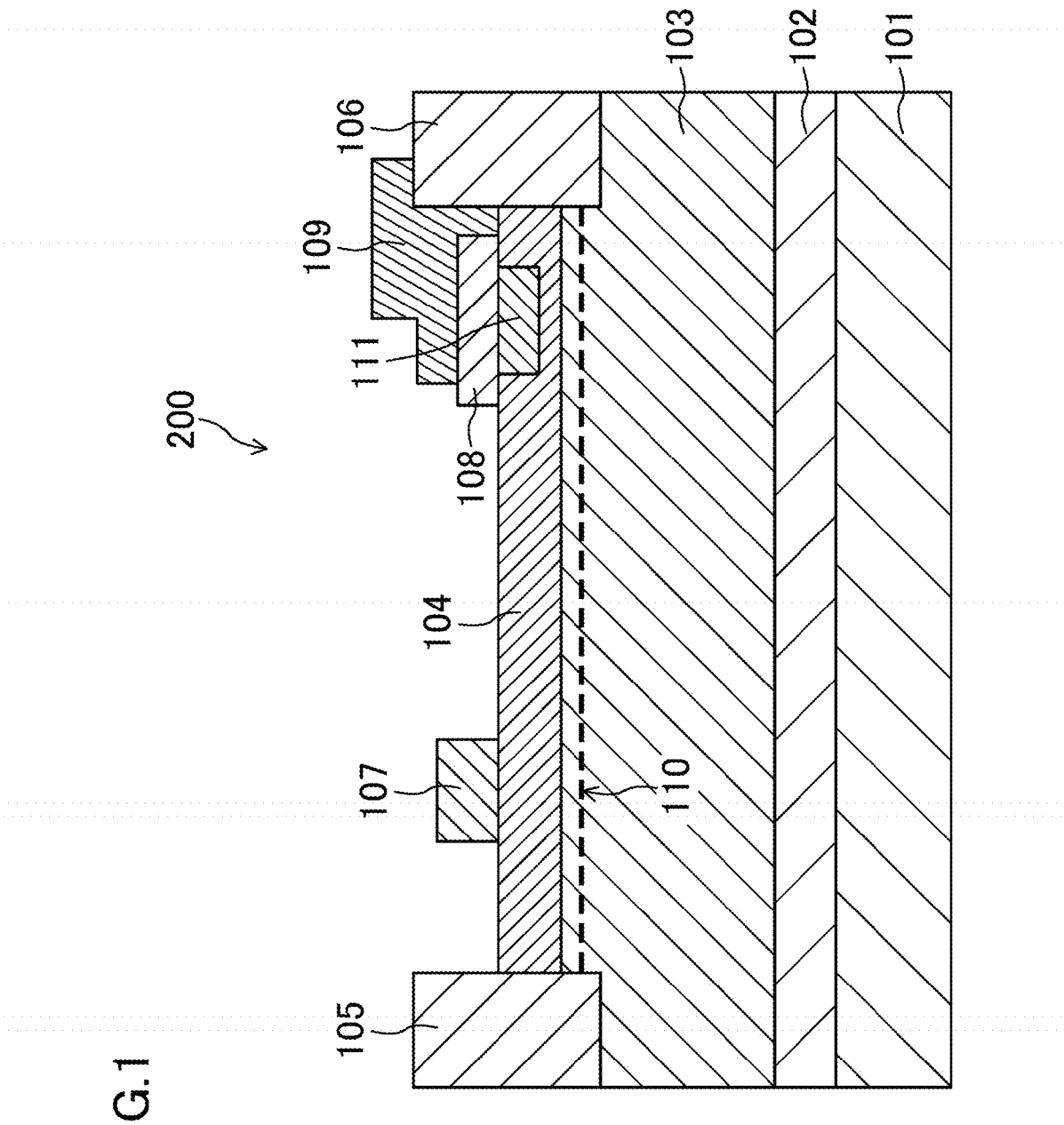
FIG. 1 is a cross-sectional view showing a semiconductor device of an embodiment of the present disclosure.

FIG. 1 is a cross-sectional view showing a semiconductor device of an embodiment of the present disclosure. In this embodiment, an HEMT is shown as an example of the field effect transistor included in the semiconductor device.

The semiconductor device of this embodiment includes a field effect transistor 200. The field effect transistor 200 has a buffer layer 102 made of low-temperature AlN formed on a substrate 101 made of p-type Si, etc., a nitride semiconductor layer (first nitride semiconductor layer) 103 formed on the buffer layer 102, a nitride semiconductor layer (second nitride semiconductor layer) 104 larger in bandgap than the nitride semiconductor layer 103 formed on the nitride semiconductor layer 103, a gate electrode 107 formed on the nitride semiconductor layer 104, and a source electrode 105 and a drain electrode 106 formed to sandwich the gate electrode 107.

The thickness of the nitride semiconductor layer 103 is of the order of 0.5 μm to 3 μm, and that of the nitride semiconductor layer 104 is of the order of 20 nm to 100 nm. The nitride semiconductor layers 103 and 104 are only required to be made of such nitride semiconductors that cause generation of two-dimensional electron gas 110 at the interface therebetween: e.g., the nitride semiconductor layer 103 is made of undoped GaN and the nitride semiconductor layer 104 is made of undoped AlGaN. The field effect transistor 200 uses this two-dimensional electron gas 110 as the channel.

The gate electrode 107 is provided by forming a p-type AlGaN layer and a p-type GaN layer on top of each other in this order and then forming an electrode made of a metal such as Au by evaporation, for example.

The source electrode 105 and the drain electrode 106 are provided to be in contact with at least the nitride semiconductor layer 104. In the example shown in FIG. 1, the source electrode 105 and the drain electrode 106 are formed on the nitride semiconductor layer 103 and in direct contact with the two-dimensional electron gas 110. The source electrode 105 and the drain electrode 106 each have a Ti layer and an Al layer, for example. Although not illustrated, the source electrode 105, the drain electrode 106, and the gate electrode 107 have a strip-like planar shape, and may be placed to be substantially in parallel with one another.

Unlike the conventional field effect transistor, the field effect transistor 200 of this embodiment further has a p-type nitride semiconductor layer 108 for hole injection formed on the nitride semiconductor layer 104 at a position between the gate electrode 107 and the drain electrode 106 and electrically connected to the drain electrode 106. The p-type nitride semiconductor layer 108 is made of a nitride semiconductor such as GaN smaller in bandgap than the nitride semiconductor layer 104, for example. Also formed is an electrode 109 connecting the p-type nitride semiconductor layer 108 to the drain electrode 106. The electrode 109 is made of a metal such as Au, for example.

Further, an n-type nitride semiconductor layer 111 is formed between the p-type nitride semiconductor layer 108 and the nitride semiconductor layer 103. In the example shown in FIG. 1, the n-type nitride semiconductor layer 111 is formed by implanting n-type impurity ions in a portion of the nitride semiconductor layer 104 made of AlGaN located right under the p-type nitride semiconductor layer 108.

The impurity concentration of the p-type nitride semiconductor layer 108 is of the order of $10^{19}$ cm$^{-3}$ to $10^{21}$ cm$^{-3}$, and that of the n-type nitride semiconductor layer 111 is of the order of $10^{17}$ cm$^{-3}$ to $10^{19}$ cm$^{-3}$. The p-type nitride semiconductor layer 108 is formed by metallorganic chemical vapor deposition (MOCVD), molecular beam epitaxy (MBE), etc., for example, and the n-type nitride semiconductor layer 111 is formed by ion implantation of Si, etc., for example.

Since no impurity is intentionally implanted in the nitride semiconductor layer 104 except for the portion where the n-type nitride semiconductor layer 111 is formed, the concentration of the n-type impurity contained in the n-type nitride semiconductor layer 111 is higher than that of any n-type impurity contained in the other portion of the nitride semiconductor layer 104.

Also, the concentration of the p-type impurity contained in the p-type nitride semiconductor layer 108 is higher than that of any p-type impurity contained in the nitride semiconductor layers 103 and 104.

Having the above-described configuration, by applying a predetermined gate voltage after applying a voltage between the source and the drain, high mobility can be achieved using the two-dimensional electron gas 110 as the channel. Also, by adjusting the gate voltage, the drain current can be controlled.

Moreover, when the field effect transistor 200 is on, holes can be injected into a portion of the nitride semiconductor layer 103 located between the drain electrode 106 and the gate electrode 107 through the electrode 109 and the p-type nitride semiconductor layer 108. The holes injected in the nitride semiconductor layer 103 move toward the source electrode 105 and recombine with electrons trapped in the nitride semiconductor layer 103. Thus, current collapse can be effectively prevented or reduced, enhancing the reliability of the field effect transistor 200 compared with the conventional field effect transistor.

It is preferable that, when the p-type nitride semiconductor layer 108 is placed apart from the drain electrode 106, the distance between the p-type nitride semiconductor layer 108 and the gate electrode 107 be larger than the distance between the p-type nitride semiconductor layer 108 and the drain electrode 106 because decrease in electric strength can be prevented. With this configuration, a sufficient electric strength can be secured even when the field effect transistor 200 is used as a power transistor for a power supply circuit, etc.

The p-type nitride semiconductor layer 108 and the drain electrode 106 may be electrically connected to each other outside the field effect transistor 200 (such as at an upper-layer interconnect). Alternatively, the p-type nitride semiconductor layer 108 and the drain electrode 106 may be directly connected not via the electrode 109.

The n-type nitride semiconductor layer 111 is provided between the two-dimensional electron gas 110 and the p-type nitride semiconductor layer 108. The n-type nitride semiconductor layer 111 is not necessarily required, but by providing the n-type nitride semiconductor layer 111, it is possible to prevent increase in channel resistance in a region right under the p-type nitride semiconductor layer 108 while preventing or reducing current collapse.

It is desirable that the hole carrier concentration of the p-type nitride semiconductor layer 108 be larger than the electron carrier concentration of the n-type nitride semiconductor layer 111 for sufficient exertion of the hole injection effect of the p-type nitride semiconductor layer 108.

—Background to Fabrication of Inventive Field Effect Transistor—

The background leading to the fabrication of the above-described field effect transistor of this embodiment by the present inventors for the purpose of preventing or reducing current collapse will be described hereinafter.

Figure 2:
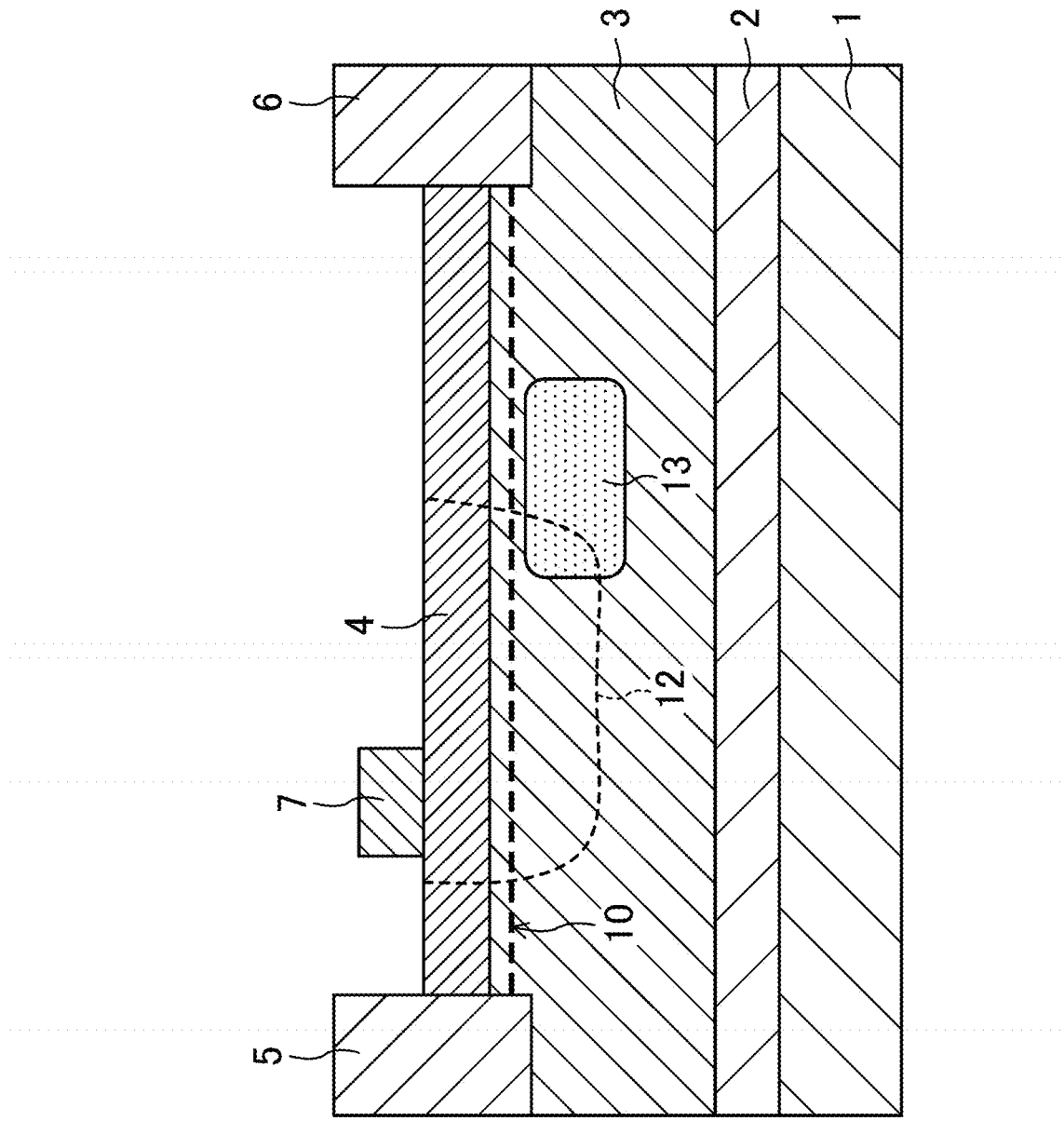
FIG. 2 is a cross-sectional view diagrammatically showing a semiconductor device including a general field effect transistor (HEMT).

First, the physical mechanism by which current collapse is caused will be briefly described. FIG. 2 is a cross-sectional view diagrammatically showing a semiconductor device including the general field effect transistor (HEMT), and shows the state when the transistor is off.

This field effect transistor has the low-temperature AlN buffer layer 2, the undoped GaN layer 3, and the undoped AlGaN layer 4 formed in this order on the p-type Si Substrate 1 as described earlier. The gate electrode 7 is formed on the undoped AlGaN layer 4, and the source electrode 5 and the drain electrode 6 made of Ti and Al are formed in contact with the undoped AlGaN layer 4 to sandwich the gate electrode 7.

The field effect transistor uses the two-dimensional electron gas 10 present at the interface between the undoped GaN layer 3 and the undoped AlGaN layer 4 as the channel. Note that the gate electrode 7 is provided by forming a p-type AlGaN layer and a p-type GaN layer on top of each other in this order and then forming an electrode made of Au, etc. by evaporation.

In the field effect transistor in an off state where a high voltage has been applied between the source and the drain, the depletion layer 12 expands downward from the gate electrode 7 across the interface between the undoped GaN layer 3 and the undoped AlGaN layer 4. In this off state, the electric field is concentrated on the drain-terminal side of the depletion layer 12, where a strong electric field is generated.

Figure 3:
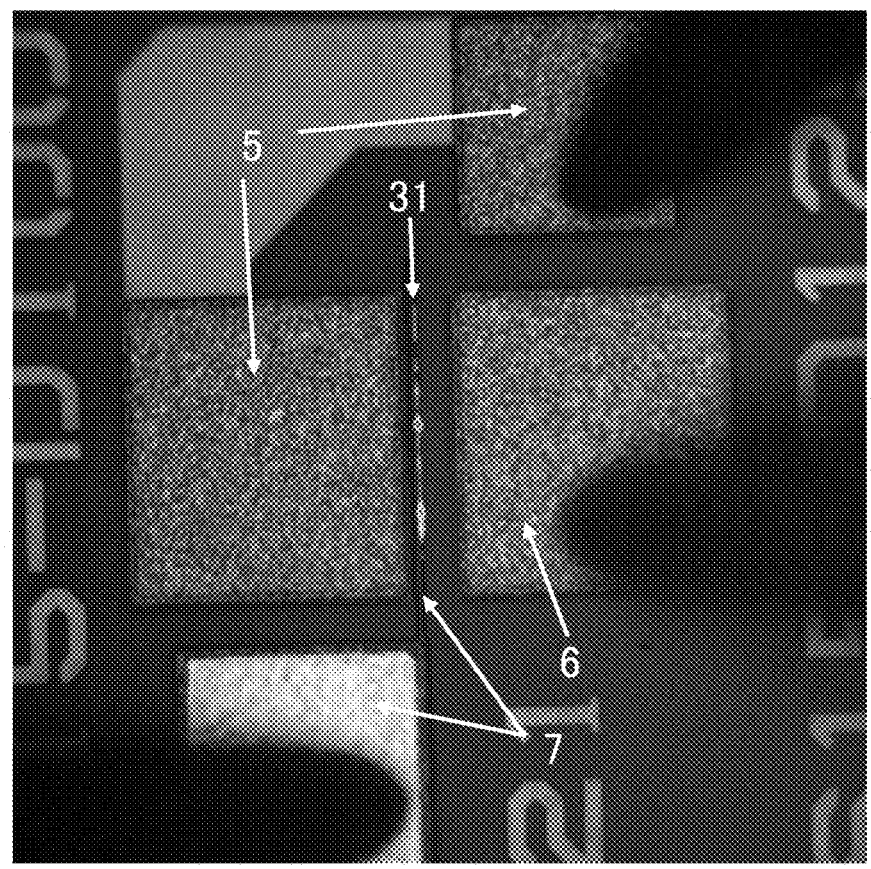
FIG. 3 is a view showing a luminescence image of the field effect transistor shown in FIG. 2 taken from above its substrate when the transistor has been turned off and then a high voltage has been applied to the drain electrode.

FIG. 3 is a view showing a luminescence image of the field effect transistor shown in FIG. 2 taken from above the substrate when the transistor has been turned off and a high voltage (VDS=400 V) has been applied to the drain electrode. A slender portion located between the source electrode 5 and the drain electrode 6 is the gate electrode 7, and a large square portion shown on the left below the gate electrode 7 is an electrode pad connected to the gate electrode 7. In FIG. 3, the electrode pad is also indicated as the gate electrode 7.

From the luminescence image shown in FIG. 3, it is found that luminescence 31 is observed on the side of the gate electrode 7 closer to the drain electrode (drain terminal) 6, i.e., near the gate electrode 7 in the area between the gate electrode 7 and the drain electrode 6, and that a strong electric field is being generated in the region where the luminescence 31 is observed. In the general HEMT using nitride semiconductors, electrons 13 are trapped in the region where the strong electric field has been applied (see FIG. 2). The trapped electrons generated at the application of a high voltage cause current collapse, which will be described hereinafter.

Figure 4:
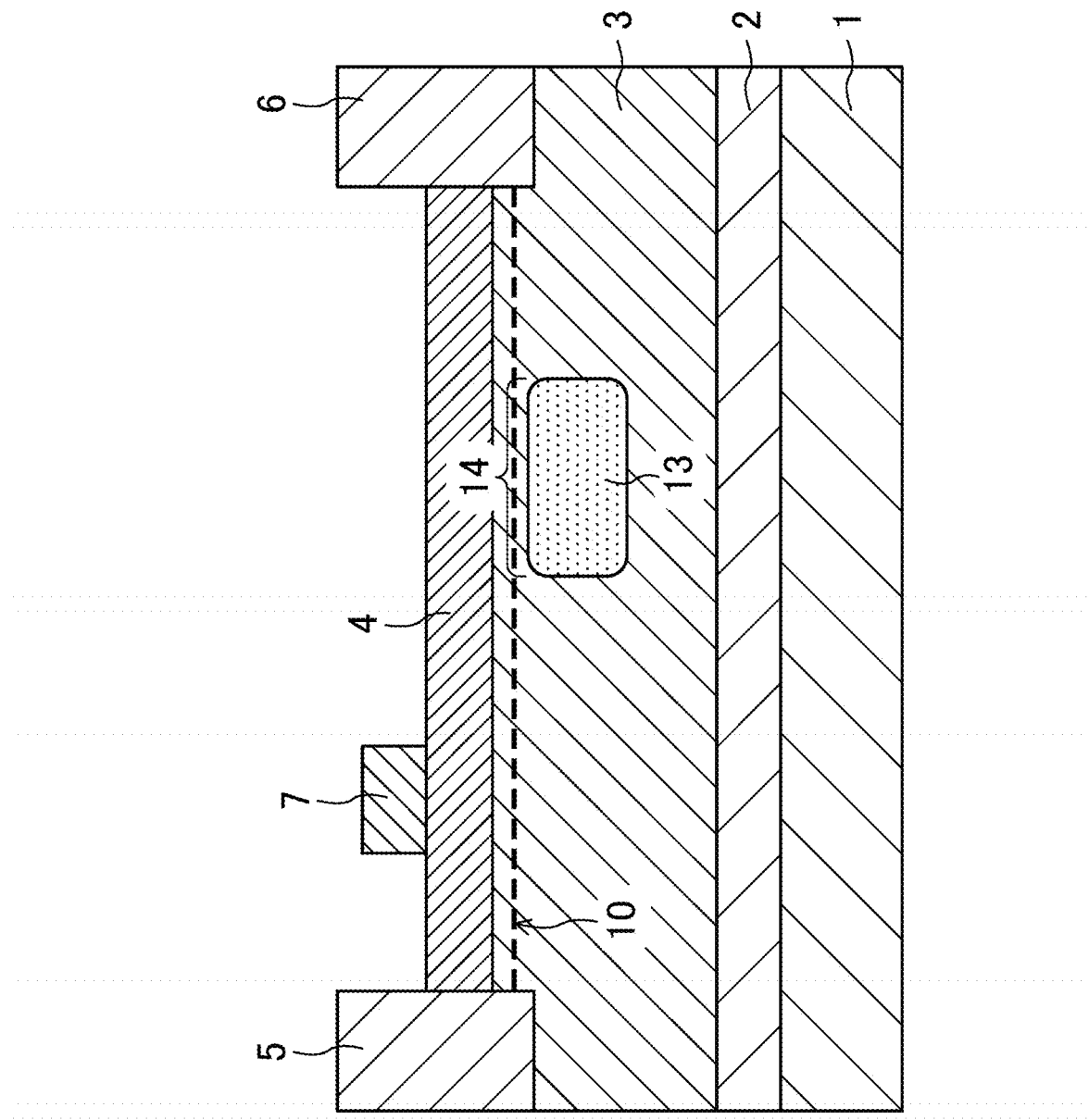

FIG. 4 is a cross-sectional view diagrammatically showing the state of the semiconductor device observed immediately after the field effect transistor, which has been turned off and then to which a drain voltage has been applied, is turned on.

As shown in FIG. 4, immediately after the field effect transistor is turned on, the electrons 13 trapped in the undoped GaN layer 3 in the off state are not removed completely but stay behind. Having the trapped electrons 13 left behind, the concentration of the two-dimensional electron gas 14 near such electrons 13 decreases compared with the case when the electrons 13 are not left behind. For this reason, the source-drain resistance increases. This is the mechanism of current collapse.

Based on the mechanism of current collapse described above, the following two coping methods are considered effective for preventing or reducing current collapse.

The first method is preventing electrons from being trapped when a high electric field is applied. For this, the trap density may be reduced. Reducing the trap density can be achieved by controlling the growth conditions of the nitride semiconductor layers and by optimizing the kind of the surface passivation film and the formation conditions thereof. For example, use of a SiN film as the surface passivation film can reduce current collapse to some extent.

The second method is preventing a high electric field from being applied. This can be achieved by forming a field plate, for example, to relax the electric field. Also effective are methods such as increasing the thickness of the nitride semiconductor layer (undoped GaN layer 3) to reduce the electric field strength between the substrate and the drain and increasing the gate-drain distance to some extent.

However, there are some cases where the above methods fail to prevent or reduce current collapse. The present inventors have therefore conducted further studies on a method for preventing or reducing current collapse in a way different from the above methods. In the course of the studies, the present inventors have considered that the remaining electrons 13 may be eliminated by injecting holes into the nitride semiconductor layer (undoped GaN layer 3) when the field effect transistor is on, to allow the holes to recombine with the trapped electrons 13 generated during the device off time, thereby permitting prevention or reduction of current collapse. This method is intrinsically different from the above-described conventional collapse prevention method of taking measures to prevent electrons from being trapped when a high electric field is applied, and an attempt to eliminate electrons trapped during the off time by recombination.

Figure 5:
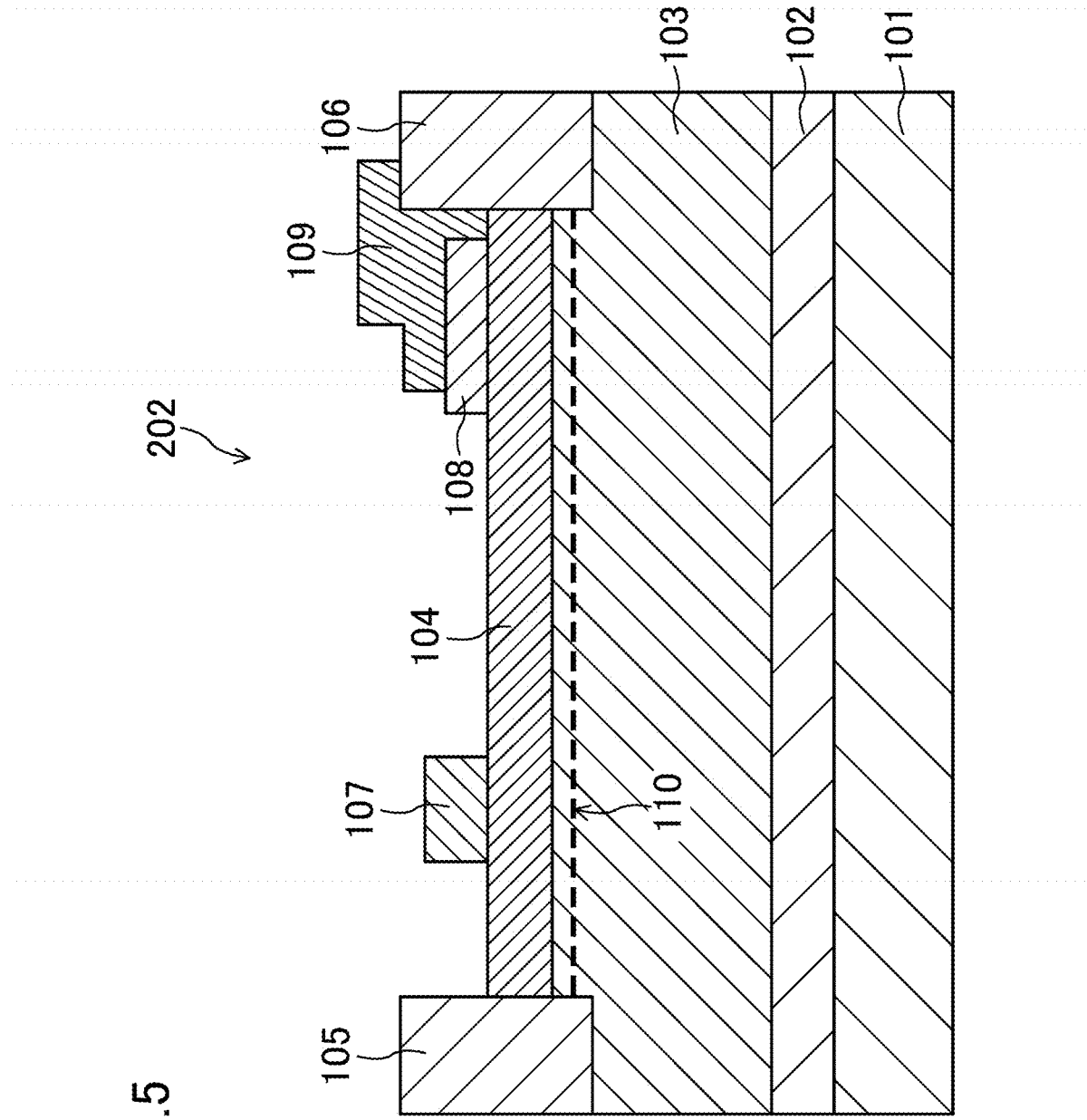
FIG. 5 is a cross-sectional view showing a semiconductor device including a field effect transistor of an example of the present disclosure.

Under the above presumption, the present inventors first fabricated a HEMT as shown in FIG. 5 as the field effect transistor 200 having a hole injection means. FIG. 5 is a cross-sectional view showing a semiconductor device including the prototype field effect transistor.

The field effect transistor 202 has a buffer layer 102 made of low-temperature AlN formed on a substrate 101 made of p-type Si, etc., a nitride semiconductor layer 103 formed on the buffer layer 102, a nitride semiconductor layer 104 larger in bandgap than the nitride semiconductor layer 103 formed on the nitride semiconductor layer 103, a gate electrode 107 formed on the nitride semiconductor layer 104, and a source electrode 105 and a drain electrode 106 formed to sandwich the gate electrode 107.

The nitride semiconductor layer 103 is made of undoped GaN and the nitride semiconductor layer 104 is made of undoped AlGaN. The source electrode 105 and the drain electrode 106 each have a Ti layer and an Al layer, and are provided to be in contact with the nitride semiconductor layer 104.

The field effect transistor 202 uses two-dimensional electron gas 110 generated between the nitride semiconductor layers 103 and 104 as the channel. The gate electrode 107 is provided by forming a p-type AlGaN layer and a p-type GaN layer on top of each other in this order and then forming an electrode made of a metal such as Au by evaporation, for example.

Moreover, as the hole injection means for prevention or reduction of current collapse, a p-type nitride semiconductor layer 108 and an electrode 109 made of Au, etc., for hole injection, are formed on a portion of the nitride semiconductor layer 104 located between the gate and the drain. The p-type nitride semiconductor layer 108 for hole injection is electrically connected to the drain electrode 106 via the electrode 109.

Figure 6:
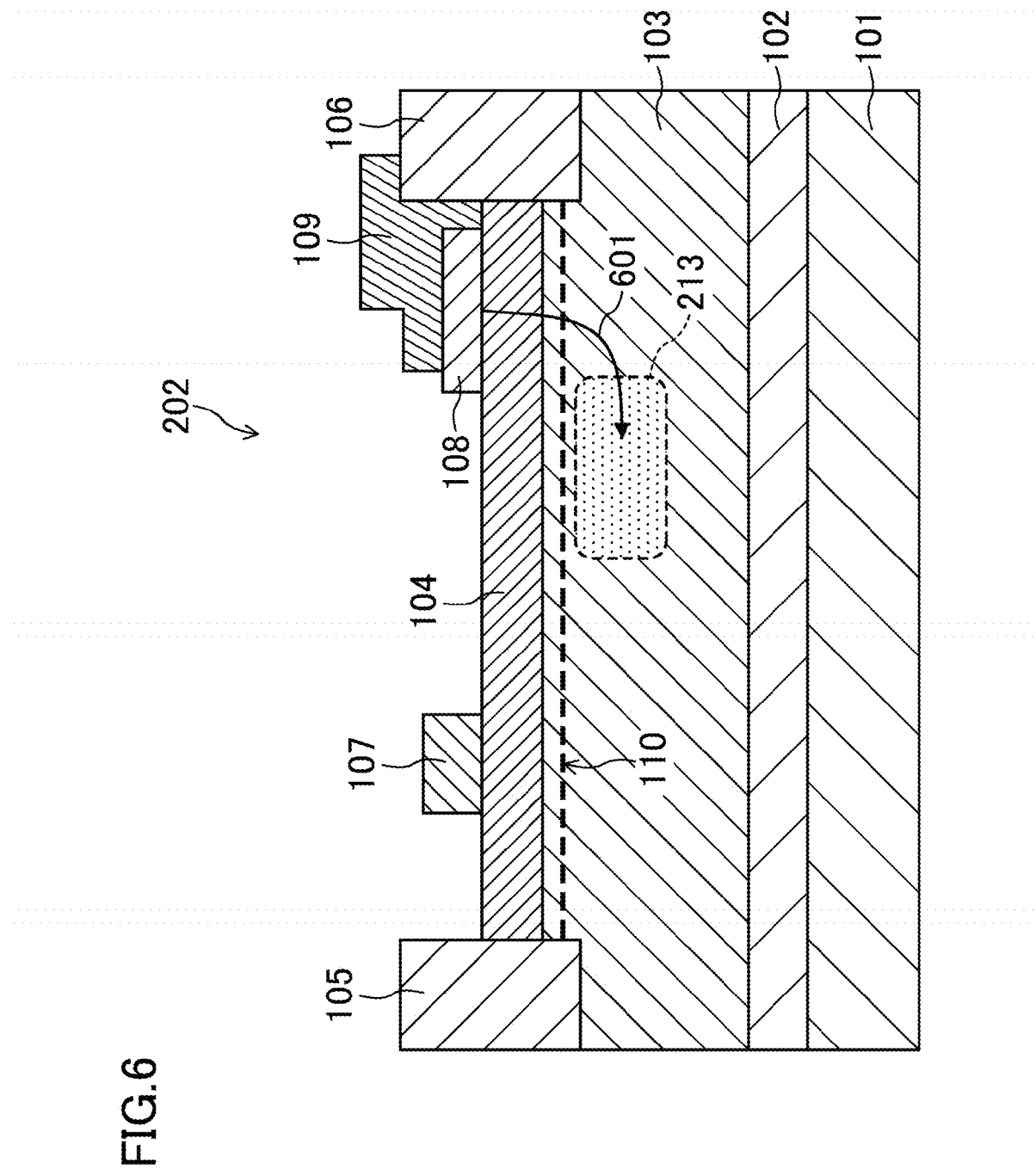

FIG. 6 is a cross-sectional view diagrammatically showing the state of the semiconductor device shown in FIG. 5 observed immediately after the field effect transistor, which has been turned off, is turned on.

As shown in FIG. 6, in the field effect transistor 202 in its on state, holes 601 injected from the p-type nitride semiconductor layer 108 into the portion of the nitride semiconductor layer 103 located between the gate and the drain move in the nitride semiconductor layer 103 toward the source drain 105. It is considered that, since the moving holes 601 can recombine with trapped electrons 213 generated during the off time of the field effect transistor 202, the trapped electrons will be eliminated. By this, it is expected that current collapse can be prevented or reduced. Why it is most preferable to form the electrode for hole injection at a position between the gate and the drain will be described hereinafter.

First, assume that a position between the gate and the source is selected as the position where the p-type nitride semiconductor layer 108 for hole injection is formed. In this case, since the holes 601 injected during the on state of the field effect transistor 202 will flow toward the source through the portion between the gate and the source, the injected holes 601 cannot serve to eliminate the electrons 213 trapped in a portion between the gate and the drain during the off time. This is not to say that this hole injection has no effect at all, because there are also electrons trapped in a portion between the gate and the source. However, it is considered that the effect of preventing or reducing current collapse will not be so large when the electrode 109 for hole injection is formed at a position between the gate and the source.

Second, it is considered to use the gate electrode 107 itself as the electrode for hole injection. That is, consider the case of forming the p-type nitride semiconductor layer 108 right under the gate electrode 107 instead of separately providing the electrode 109 for hole injection and the p-type nitride semiconductor layer 108. In this case, as in the above case, the holes 601 injected into the nitride semiconductor layer 103 from the gate electrode 107 will flow toward the source electrode 105, never crossing the key portion between the gate and the drain where a number of trapped electrons 213 are present. It is therefore hard to expect that the trapped electrons 213 can be completely eliminated by recombination. However, in the off state, where a strong electric field is also applied to the region right under the gate, trapped electrons 213 are also present in the region right under the gate. Therefore, current collapse can be reduced to some extent by using the gate electrode 107 itself as the electrode for hole injection.

From the examination described above, it is considered most desirable to form the electrode (terminal) 109 and the p-type nitride semiconductor layer 108 for hole injection at a position closer to the drain electrode (terminal) 106 with respect to the region where electrons are trapped during the off time of the field effect transistor 202. That is, it is desirable to form the p-type nitride semiconductor layer 108 for hole injection at at least one position in the region between the gate and the drain, and more desirable to form the p-type nitride semiconductor layer 108 at a position in the region between the gate and the drain closer to the drain electrode 106. With this formation, the holes 601 injected from the electrode 109 for hole injection can efficiently recombine with the trapped electrons 213 when moving toward the source electrode 105 during the on state of the field effect transistor 202. As a result, it is presumed that the electrons trapped in the nitride semiconductor layer 103 during the off time of the field effect transistor 202 will be eliminated, permitting prevention or reduction of current collapse.

The reason why it is necessary to form the p-type nitride semiconductor layer 108 for hole injection at a position in the region between the gate and the drain as close as possible to the drain electrode 106 is that, with the hole injection terminal being electrically connected to the drain terminal, the electric strength will decrease if the distance between the gate and the hole injection terminal is short.

Figure 7:
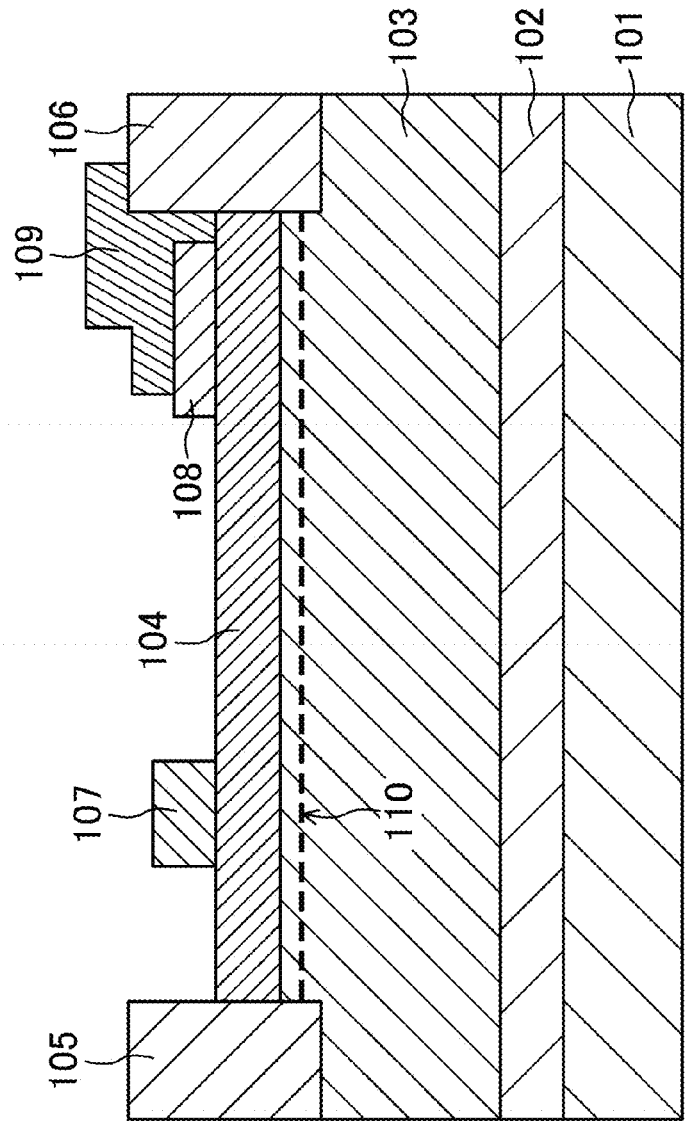
FIG. 7 is a cross-sectional view of a semiconductor device of an embodiment of the present disclosure, including a field effect transistor actually fabricated by the present inventors.

FIG. 7 is a cross-sectional view of a semiconductor device including a field effect transistor actually fabricated based on the studies described above. In the field effect transistor 204 shown in FIG. 7, a p-type AlGaN layer is used as the gate electrode 107. With this p-type AlGaN layer, the potential of the nitride semiconductor layer 104 made of AlGaN increases, thereby preventing or reducing generation of two-dimensional electron gas below the gate and thus achieving a normally-off device (see Yasuhiro Uemoto, Masahiro Hikita, Hiroaki Ueno, Hisayoshi Matsuo, Hidetoshi Ishida, Manabu Yanagihara, Tetsuzo Ueda, Tsuyoshi Tanaka, Daisuke Ueda, "Gate Injection Transistor (GIT)—A Normally-Off AlGaN/GaN Power Transistor Using Conductivity Modulation," IEEE Trans. Electro. Dev. 54, 3393 (2007)).

The reason why the normally-off device was fabricated is that this field effect transistor is intended to be used as a power device and, in this case, the normally-off type is desirable from a practical standpoint. By using a p-type nitride semiconductor layer as the gate electrode, a normally-off device can be achieved as described above, and the device can be turned on by applying a predetermined gate voltage.

Note however that the technique of preventing or reducing current collapse described herein is applicable, not only to normally-off field effect transistors, but also to normally-on devices. Therefore, any gate structure may be used for the field effect transistor. For example, a metal electrode made of Ni, etc. coming into schottky contact with the nitride semiconductor layer 104 may be used as the gate electrode, or a MOS structure having an insulating film sandwiched between the gate electrode and the nitride semiconductor layer 104 may be formed. That is, any gate structure can be used without causing a trouble, and the collapse prevention/reduction technology described herein imposes no limitation on the structure of the gate electrode.

Next, the present inventors evaluated the on resistance at the time of switching of the fabricated field effect transistor 204 shown in FIG. 7.

Figure 8B:
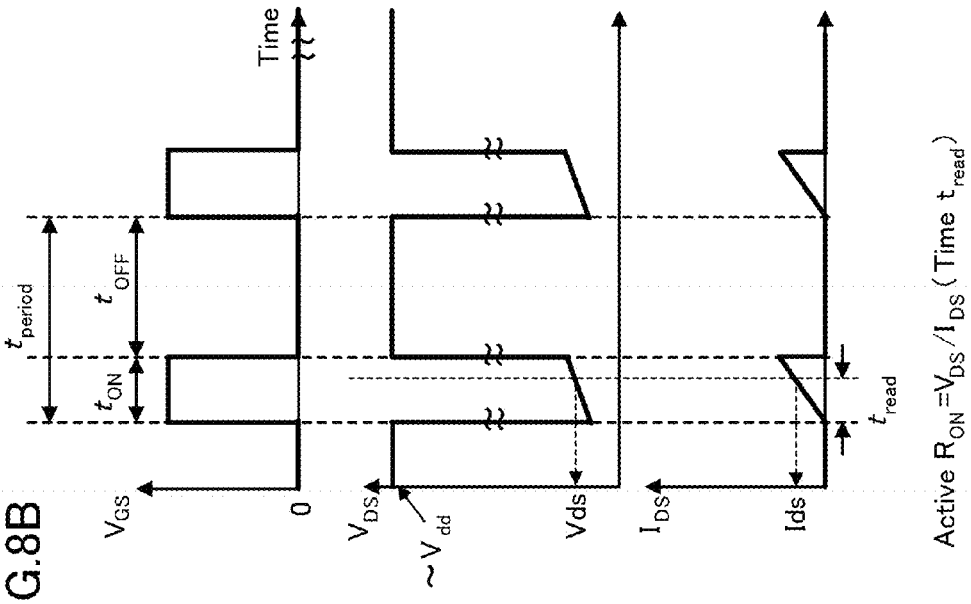
FIG. 8B is a view illustrating the timing of measurement of the field effect transistor.
Figure 8A:
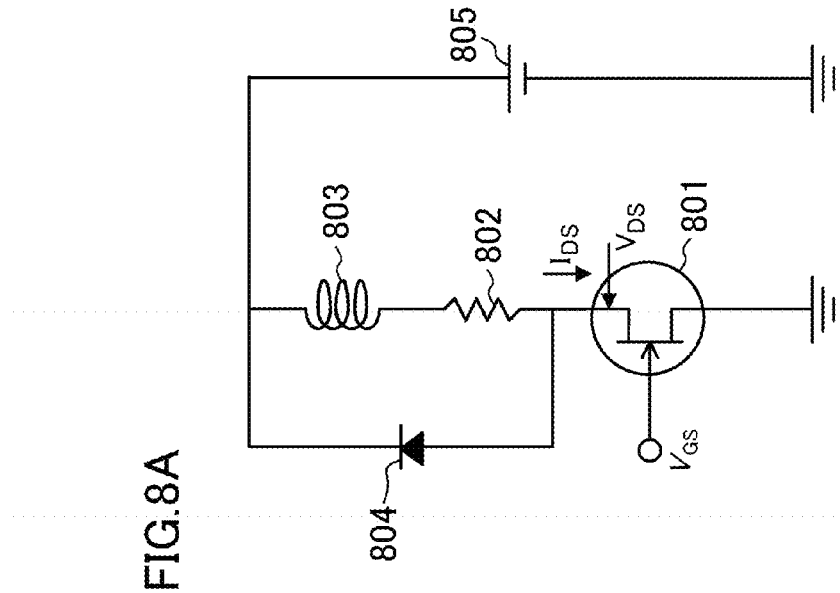
FIG. 8A is an electric circuit diagram for evaluating current collapse in the field effect transistor according to the present disclosure.

FIGS. 8A and 8B are a circuit diagram and a waveform diagram, respectively, showing an evaluation system for the on resistance during switching of a field effect transistor. The on-resistance evaluation system shown in FIGS. 8A and 8B is a system for evaluating current collapse. The field effect transistor and the semiconductor device including the same are intended to be mounted in an air conditioner, etc. Therefore, to evaluate the on resistance in situations such as that where a motor used in the air conditioner, etc. is inverter-operated, the on resistance at the time of switching of the LR series load was evaluated.

First, the evaluation system used here will be described in detail. A resistance load 802 of 5Ω, for example, and a coil 803 of 2 mH, for example, are connected in series to the drain terminal of a field effect transistor 801, and a voltage $V_{dd}$ is applied to the entire series circuit by a voltage source 805. Note that, for protection of the electric circuit, a reflux diode 804 is connected in parallel with the series circuit of the resistance load and the coil.

In this measurement circuit, the field effect transistor 801 was continuously switched on/off, and a current $I_{DS}$ flowing through the field effect transistor and an on voltage $V_{DS}$ of the field effect transistor were measured at a time as short as possible after the field effect transistor was turned on ($t_{read}$ seconds after the turning on), to determine the on resistance $R_{ON}$ of the field effect transistor=$V_{DS}/I_{DS}$. For simplicity, the on resistance $R_{ON}$ of the field effect transistor at this switching is hereinafter referred to as "active $R_{ON}$" to distinguish this from the on voltage of the field effect transistor (under a low $V_{dd}$ condition) obtained by measurement of static characteristics (hereinafter referred to as "DC-$R_{ON}$"). The active $R_{ON}$ increases with increase of $V_{dd}$ when it is influenced by current collapse.

Using the above evaluation system, the active $R_{ON}$ was measured in the following manner, to examine the $V_{dd}$ dependence: a pulse voltage having a period $t_{period}$ of 143 µs and an on time $t_{ON}$ of 7.5 µs was periodically given to the gate electrode 107, and, after this was kept for a fixed time until the on voltage was stabilized, a waveform obtained immediately after the transistor was turned on (7 µs after the switching to the on state) was captured into an oscilloscope. The reason why the measurement time was set to a time immediately (7 µs) after the turning on is as follows. In the actual measurement using this measurement system, linking appeared under an influence of a parasitic capacitance of the evaluation system in the time range shorter than the above time, failing to perform correct measurement. The linking disappeared 7 µs after the switching to the on state, succeeding in measurement of the correct on voltage.

Figure 9:
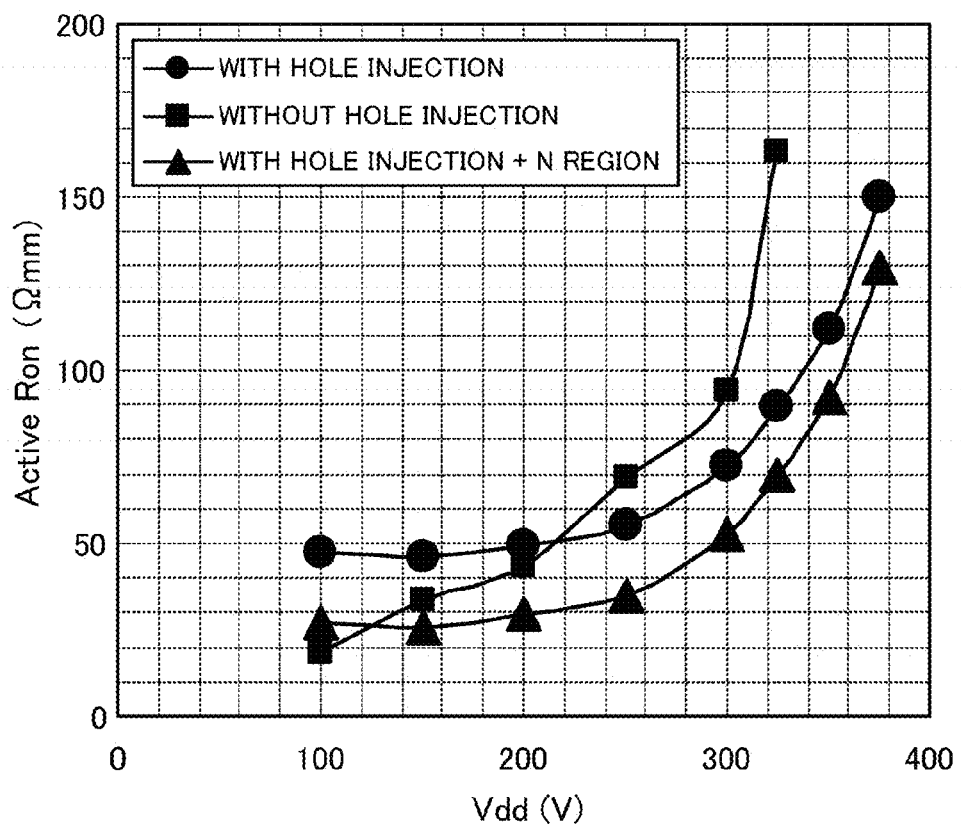
FIG. 9 is a view expressing the relationships between active $R_{on}$ and $V_{dd}$ for a field effect transistor having no structure for hole injection, one having a structure for hole injection, and one having an n-type nitride semiconductor layer provided for the structure for hole injection, measured using the evaluation system shown in FIGS. 8A and 8B.

FIG. 9 is a view showing the results of the evaluation of the field effect transistor 204 shown in FIG. 7 using the evaluation system shown in FIGS. 8A and 8B. In FIG. 9, the black circles (●) indicate the measurement results of the field effect transistor 204 shown in FIG. 7, and the black squares (■) indicate the relationship between the active $R_{ON}$ and $V_{dd}$ of the field effect transistor (FIG. 4) having no p-type nitride semiconductor layer for hole injection measured for comparison.

From the results shown in FIG. 9, it is evident that the active $R_{ON}$ has been reduced to a low value in the case of having hole injection, compared with the case of having no hole injection, in a high-$V_{dd}$ range (about 210 V or more in the illustrated measurement conditions). For example, at $V_{dd}$=320 V, the active $R_{ON}$ has been reduced to roughly the half in the case of having hole injection, compared with the case of having no hole injection, significantly exhibiting prevention or reduction of current collapse by hole injection.

As described above, it has been confirmed that current collapse can be effectively prevented or reduced by providing a p-type nitride semiconductor layer made of p-type GaN, for example, between the gate electrode and the drain electrode and electrically connecting the p-type nitride semiconductor layer to the drain electrode.

However, according to the results shown in FIG. 9, in a low-$V_{dd}$ range, the active $R_{ON}$ is large in the case of having hole injection, compared with the case of having no hole injection. The present inventors have contemplated the reason for this as follows.

FIGS. 10A to 10C are views diagrammatically showing band alignment in a region right under the electrode (terminal) 109 for hole injection when the electrode 109 is formed, in comparison with the case of forming no such electrode: FIG. 10A shows band alignment in a field effect transistor where neither the electrode 109 nor the p-type nitride semiconductor layer 108 for hole injection is formed, and FIG. 10B shows band alignment in the field effect transistor where both the electrode 109 and the p-type nitride semiconductor layer 108 for hole injection are formed.

When the electrode 109 and the p-type nitride semiconductor layer 108 for hole injection are formed, the potential of the nitride semiconductor layer 104 made of AlGaN increases under the influence of the p-type nitride semiconductor layer 108, resulting in decrease in the concentration of the two-dimensional electron gas. This is considered to be the cause of increase in resistance right under the electrode 109 for hole injection.

In view of the above, the present inventors have made an examination on reducing the resistance right under the p-type nitride semiconductor layer 108 (and the electrode 109) for hole injection thereby preventing or reducing the increase in active $R_{ON}$ in the low-$V_{dd}$ region. To achieve this, Si as an n-type impurity has been diffused in a portion of the nitride semiconductor layer 104 right under the p-type nitride semiconductor layer 108, to form an n-type nitride semiconductor layer.

FIG. 10C is a view showing band alignment in an under-gate region observed when an n-type impurity is diffused in a region located right under the electrode (terminal) 109 and the p-type nitride semiconductor layer 108 for hole injection.

With formation of the n-type nitride semiconductor layer, it is presumed that the potential of the nitride semiconductor layer made of AlGaN will decrease under the influence of the built-in potential at the p-n junction, resulting in increase in the concentration of the two-dimensional electron gas, and thus decreasing the channel resistance in this region. Also, in the on state of the field effect transistor, the direction from the p-type nitride semiconductor layer for hole injection toward the n-type nitride semiconductor layer right under the p-type nitride semiconductor layer is the forward direction. Holes are therefore injected without causing a trouble. It is desirable that the hole carrier concentration of the p-type nitride semiconductor layer be larger than the electron carrier concentration of the n-type nitride semiconductor layer. Specifically, it is desirable that the hole carrier concentration be of the order of $5 \times 10^{18}$ cm$^{-3}$ and the carrier concentration of the n-type nitride semiconductor layer be of the order of $1 \times 10^{18}$ cm$^{-3}$. With such concentrations, it is considered possible to reduce the DC-$R_{ON}$ while maintaining the effect of preventing or reducing current collapse by hole injection.

Under the above presumption, the present inventors fabricated a semiconductor device including the field effect transistor 200 of the embodiment shown in FIG. 1, and the current collapse in this field effect transistor was examined.

The configuration of the field effect transistor 200 of this embodiment shown in FIG. 1 is as described above, where the p-type nitride semiconductor layer 108 for hole injection made of GaN is formed on the nitride semiconductor layer 104 at a position between the gate electrode 107 and the drain electrode 106. Further, the n-type nitride semiconductor layer 111 is formed in a region of the nitride semiconductor layer 104 made of AlGaN located right under the p-type nitride semiconductor layer 108. The p-type nitride semiconductor layer 108 is electrically connected to the drain electrode via the electrode 109 made of Au, etc.

After the sequential formation of the buffer layer 102, the undoped nitride semiconductor layer 103, and the undoped nitride semiconductor layer 104 on the substrate 101 by a known method, Si is implanted in a portion of the nitride semiconductor layer 104 by ion implantation before formation of the p-type nitride semiconductor layer 108. Thereafter, the Si ions are activated by annealing to form the n-type nitride semiconductor layer 111.

The black triangles (▲) in FIG. 9 indicate the results of measurement of the relationship between the active $R_{ON}$ and $V_{dd}$ in the field effect transistor 200 shown in FIG. 1 formed in the manner described above. From the results, it has been found that, in the field effect transistor shown in FIG. 1, the active $R_{ON}$ has decreased in the entire range measured, compared with the case of having hole injection without provision of the n-type nitride semiconductor layer. Also, the active $R_{ON}$ in the field effect transistor shown in FIG. 1 has been kept low in the entire range excluding when $V_{dd}$ is 100V, compared with the case of having no hole injection. Thus, it has been confirmed that, by fabricating the field effect transistor having the configuration shown in FIG. 1, current collapse can be effectively prevented or reduced while the on resistance at DC electricity is kept to a low value.

Note that, while the n-type nitride semiconductor layer 111 is formed by implanting an n-type impurity in a portion of the nitride semiconductor layer 104 in the field effect transistor 200 of this embodiment shown in FIG. 1, it is also considered possible to prevent or reduce current collapse while reducing the on resistance by forming an n-type nitride semiconductor layer made of GaN, etc. between the nitride semiconductor layer 104 and the p-type nitride semiconductor layer 108 by MOCVD, ion implantation, etc.

Alteration of Field Effect Transistor of Embodiment

Figure 11:
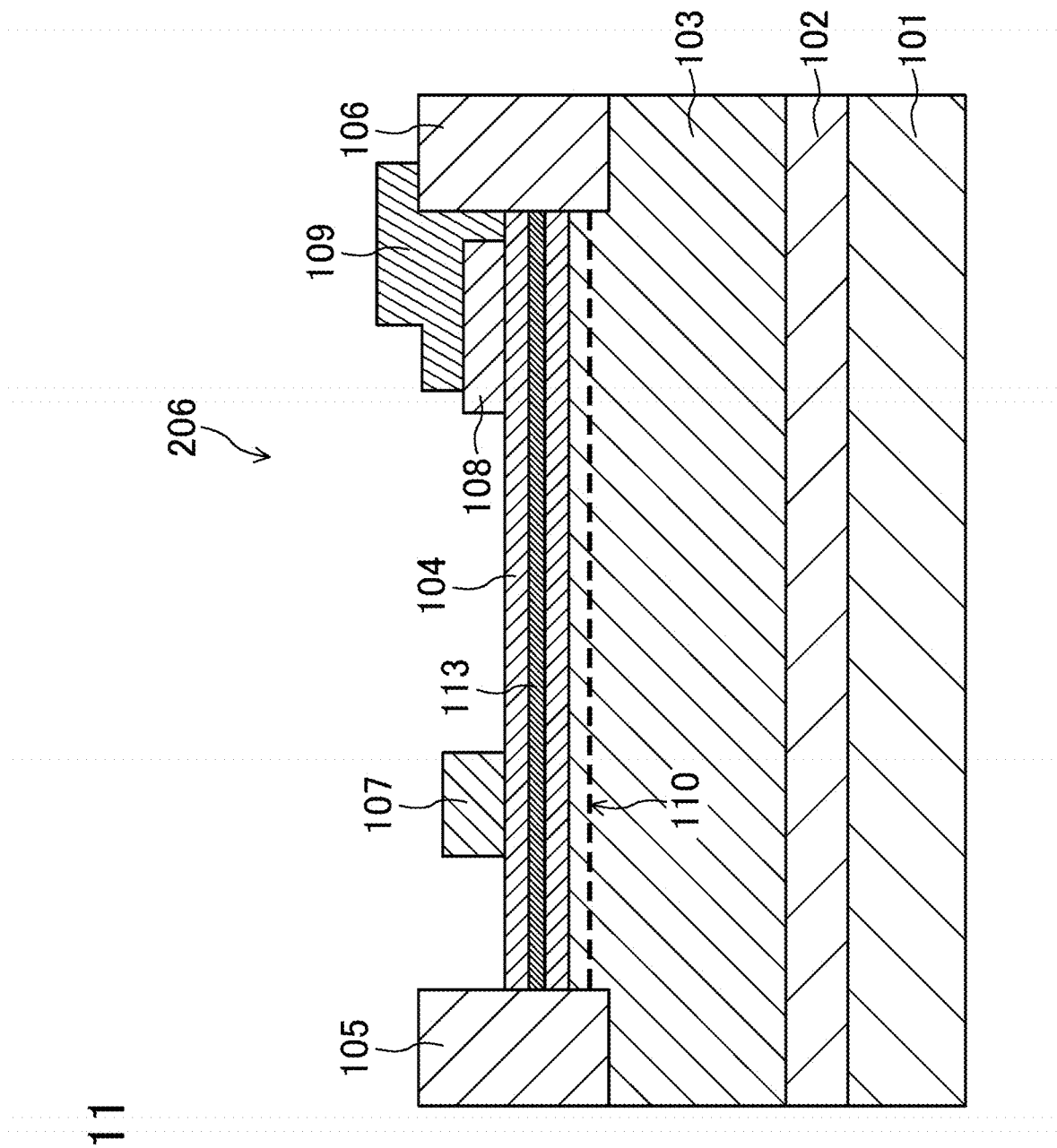
FIG. 11 is a cross-sectional view showing an alteration of the semiconductor device of the embodiment shown in FIG. 1.
Figure 12:
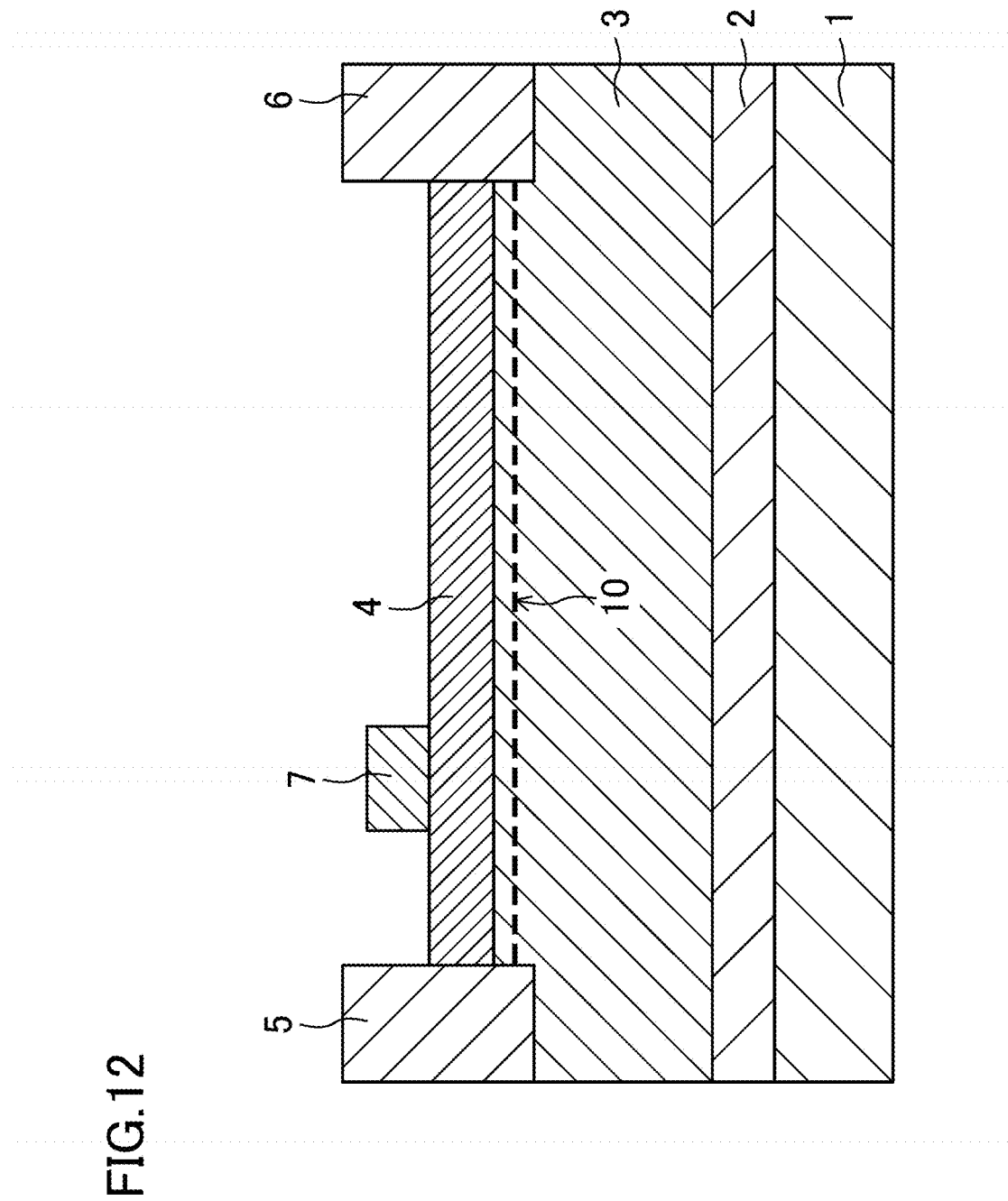
FIG. 12 is a cross-sectional view of a semiconductor device including a conventional HEMT having an AlGaN/GaN heterostructure.

FIG. 11 is a cross-sectional view showing an alteration of the semiconductor device of the embodiment shown in FIG. 1. The semiconductor device of this alteration includes a field effect transistor 206 where the n-type nitride semiconductor layer 111 of the field effect transistor (HEMT) 200 shown in FIG. 1 is replaced with an n-type nitride semiconductor layer 113 different in formation method and shape.

That is, the field effect transistor 206 of this alteration has a buffer layer 102 made of low-temperature AlN formed on a substrate 101 made of p-type Si, etc., a nitride semiconductor layer 103 formed on the buffer layer 102, a nitride semiconductor layer 104 larger in bandgap than the nitride semiconductor layer 103 formed on the nitride semiconductor layer 103, a gate electrode 107 formed on the nitride semiconductor layer 104, and a source electrode 105 and a drain electrode 106 formed to sandwich the gate electrode 107.

The nitride semiconductor layer 103 has a thickness of the order of 0.5 μm to 3 μm and made of undoped GaN, for example. The nitride semiconductor layer 104 has a thickness of the order of 20 nm to 100 nm and made of undoped AlGaN, for example. Note however that the nitride semiconductor layers 103 and 104 are only required to be made of such nitride semiconductors that cause generation of two-dimensional electron gas 110 at the interface therebetween. The field effect transistor 206 uses this two-dimensional electron gas 110 as the channel.

The gate electrode 107 is provided by forming a p-type AlGaN layer and a p-type GaN layer on top of each other in this order and then forming an electrode made of a metal such as Au by evaporation, for example.

The source electrode 105 and the drain electrode 106 are provided to be in contact with at least the nitride semiconductor layer 104.

In the example shown in FIG. 11, the source electrode 105 and the drain electrode 106 are formed on the nitride semiconductor layer 103 and in direct contact with the two-dimensional electron gas 110. The source electrode 105 and the drain electrode 106 each have a Ti layer and an Al layer, for example. Although not illustrated, the source electrode 105, the drain electrode 106, and the gate electrode 107 have a strip-like planar shape, and may be placed to be substantially in parallel with one another.

Unlike the conventional field effect transistor, the field effect transistor 206 of this alteration further has a p-type nitride semiconductor layer 108 for hole injection formed on the nitride semiconductor layer 104 at a position between the gate electrode 107 and the drain electrode 106 and electrically connected to the drain electrode 106. The p-type nitride semiconductor layer 108 is made of a nitride semiconductor such as GaN smaller in bandgap than the nitride semiconductor layer 104, for example. Also formed is an electrode 109 connecting the p-type nitride semiconductor layer 108 to the drain electrode 106. The electrode 109 is made of a metal such as Au, for example.

The field effect transistor 206 of this alteration is different from the field effect transistor 200 shown in FIG. 1 in that the n-type nitride semiconductor layer 113 is formed in the nitride semiconductor layer 104 made of AlGaN, for example, extending from underneath the p-type nitride semiconductor layer 108 to the position in contact with the source electrode 105 and to the position in contact with the drain electrode 106. The n-type impurity concentration of the n-type nitride semiconductor layer 113 is of the order of $10^{17}$ cm$^{-3}$ to $5 \times 10^{18}$ cm$^{-3}$.

In the field effect transistor 206 of this alteration, also, where the p-type nitride semiconductor layer 108 and the electrode 109 for prevention or reduction of current collapse are formed and the n-type nitride semiconductor layer 113 is formed right under the p-type nitride semiconductor layer 108 for hole injection, the DC-$R_{ON}$ can also be prevented or reduced. Further, since the n-type nitride semiconductor layer 113 can be formed by epitaxial growth of an n-type AlGaN layer, not by ion implantation, during the formation of the nitride semiconductor layer 104, the manufacturing process can be simplified compared with the case of performing ion implantation.

Note that, although the n-type nitride semiconductor layer 113 is not necessarily required to be in direct contact with the p-type nitride semiconductor layer 108 as shown in FIG. 11, the n-type nitride semiconductor layer 113 and the p-type nitride semiconductor layer 108 may form a p-n junction.

In the field effect transistor of this embodiment and the alteration thereof described above, the materials, thicknesses, shapes, impurity concentrations, etc. of the components can be changed appropriately as long as such changes do not depart from the spirit of the present disclosure. For example, the substrate 101 may be made of a compound semiconductor such as GaN, in addition to a Group 14 element such as Si, or may be made of an insulator such as sapphire. When a GaN substrate is used, it is unnecessary to form the buffer layer 102 shown in FIG. 1, etc.

Also, in the field effect transistors shown in FIGS. 1, 5, and 11, the distance from the gate electrode 107 to the drain electrode 106 is made larger than the distance from the gate electrode 107 to the source electrode 105 for improving the electric strength, but the distances between the electrodes can be changed appropriately depending on the requirements such as the required electric strength.

Further, the configurations described above may be combined with other configurations for reducing current collapse. For example, in the field effect transistors shown in FIGS. 1, 5, and 11, an insulating film made of SiN may be formed on the nitride semiconductor layer 104 to further ensure prevention or reduction of current collapse.

Moreover, in the semiconductor device including the field effect transistor of this embodiment or the alteration thereof, a plurality of field effect transistors may be provided, or another semiconductor element and the inventive field effect transistor may be combined.

The field effect transistor of an example of the present disclosure is useful as a power transistor used for a power supply circuit, etc. of a consumer appliance such as an air conditioner.

What is claimed is:

1. A semiconductor device comprising a field effect transistor, the transistor having a first nitride semiconductor layer formed on a substrate, a second nitride semiconductor layer larger in bandgap than the first nitride semiconductor layer formed on the first nitride semiconductor layer, a gate electrode formed on the second nitride semiconductor layer, and a source electrode and a drain electrode formed to sandwich the gate electrode each being in contact with at least the second nitride semiconductor layer, the transistor using two-dimensional electron gas formed at an interface between the first nitride semiconductor layer and the second nitride semiconductor layer as a channel, wherein the field effect transistor further has a p-type nitride semiconductor layer formed on the second nitride semiconductor layer at a position between the gate electrode and the drain electrode and electrically connected to the drain electrode, and an n-type nitride semiconductor layer is formed between the p-type nitride semiconductor layer and the first nitride semiconductor layer.

2. The semiconductor device of claim 1, wherein the n-type nitride semiconductor layer is formed in a region inside the second nitride semiconductor layer or on the second nitride semiconductor layer located right under the p-type nitride semiconductor layer.

3. The semiconductor device of claim 1, wherein the n-type nitride semiconductor layer is formed inside the second nitride semiconductor layer, and the n-type impurity concentration of the n-type nitride semiconductor layer is higher than the n-type impurity concentration of the second nitride semiconductor layer excluding the region of the n-type nitride semiconductor layer.

4. The semiconductor device of claim 1, wherein the hole carrier concentration of the p-type nitride semiconductor layer is larger than the electron carrier concentration of the n-type nitride semiconductor layer.

5. The semiconductor device of claim 1, wherein the n-type nitride semiconductor layer is formed inside the second nitride semiconductor layer, extending from underneath the p-type nitride semiconductor layer to a position in contact with the source electrode and to a position in contact with the drain electrode.

6. The semiconductor device of claim 1, wherein the field effect transistor further has an electrode connecting the p-type nitride semiconductor layer to the drain electrode.

7. The semiconductor device of claim 1, wherein the p-type nitride semiconductor layer is placed apart from the drain electrode, and the distance between the p-type nitride semiconductor layer and the gate electrode is larger than the distance between the p-type nitride semiconductor layer and the drain electrode.

8. The semiconductor device of claim 1, wherein the first nitride semiconductor layer is made of GaN, and the second nitride semiconductor layer is made of AlGaN.

9. The semiconductor device of claim 1, wherein the p-type nitride semiconductor layer is made of p-type GaN.

10. The semiconductor device of claim 1, wherein the p-type impurity concentrations of the first nitride semiconductor layer and the second nitride semiconductor layer are both lower than the p-type impurity concentration of the p-type nitride semiconductor layer.

* * * * *